United States Patent
Le Liboux et al.

(10) Patent No.: US 8,345,730 B2
(45) Date of Patent: Jan. 1, 2013

(54) INTERFERENCE SIGNAL REDUCTION METHOD AND RECEIVER

(75) Inventors: Jean-Christophe Le Liboux, Paris (FR); Nicolas Descomps, Paris (FR); Ghislain Luneau, Paris (FR)

(73) Assignee: Sagem Defense Securite, Paris (FR)

( * ) Notice: Subject to any disclaimer, the term of this patent is extended or adjusted under 35 U.S.C. 154(b) by 79 days.

(21) Appl. No.: 12/968,136

(22) Filed: Dec. 14, 2010

(65) Prior Publication Data

US 2012/0155582 A1 Jun. 21, 2012

(30) Foreign Application Priority Data

Dec. 15, 2009 (FR) ..................................... 09 06083

(51) Int. Cl.
*H04B 1/00* (2006.01)

(52) U.S. Cl. ..... 375/148; 375/345; 375/346; 455/234.1; 455/245.1; 455/296

(58) Field of Classification Search .................. 375/130, 375/144, 148, 345–346, 285; 455/234.1, 455/245.1, 296
See application file for complete search history.

(56) References Cited

U.S. PATENT DOCUMENTS

| 5,396,657 A * | 3/1995 | Jokinen .......................... 455/307 |
| 7,088,978 B2 * | 8/2006 | Hui et al. ....................... 455/296 |
| 7,324,037 B1 | 1/2008 | Tan et al. |
| 2007/0025479 A1 | 2/2007 | Anderson et al. |
| 2008/0084917 A1 * | 4/2008 | Sung et al. ..................... 375/130 |

OTHER PUBLICATIONS

Frank Amoroso, Adaptive A/D Converter to Suppress CW Interference in DSPN Spread Spectrum Communications, Military Communications Conference, Oct. 31, 1983, pp. 720-728.

S. Deshpande, Interference Effects on the GPS Signal Acquistion, National Technical Meeting, Institute of Navigation, Jan. 28, 2004, pp. 1-11.

* cited by examiner

*Primary Examiner* — Jean B Corrielus

(74) *Attorney, Agent, or Firm* — Blakely, Sokoloff, Taylor & Zafman (57) ABSTRACT

A method and receiver for reducing a signal (B) interfering with a broadband spread-spectrum signal (A) reaching a receiver (100), the receiver (100) including an interference signal (B) reduction system (20) incorporating an automatic gain controller (21), said method characterized in that the controller (21) continuously carries out a normalization (B') of an instantaneous peak amplitude of the signal (B), wherein said instantaneous peak amplitude is constant in time for the signal thus normalized (B').

8 Claims, 7 Drawing Sheets

INTERFERENCE SIGNAL REDUCTION METHOD AND RECEIVER

TECHNICAL FIELD OF THE INVENTION

The present invention relates to a method for reducing a signal interfering with a broadband spread-spectrum signal for a receiver, the receiver including an interference signal reduction system including an automatic gain controller.

It also relates to a receiver implementing the method.

The invention may be applied advantageously, but without limitation, to spread-spectrum broadband signals of the GPS (Global Positioning System) or GNSS (Global Navigation Satellite System) types.

BACKGROUND OF THE INVENTION

The known GPS (or GNSS) localization principle uses measurements of radio signals received from a constellation of satellites.

The considerable distance of the satellites from the Earth, as well as the spread-spectrum techniques used, result in the radio signals received at the surface of the Earth having very low power (−130 dBm, or $10^{-16}$ Watts).

GPS signals are therefore very sensitive to interference (intentional or not) from other radio equipment.

The interference can for instance be the out-of-band emission of a television transmitter within the GPS frequencies, or a high-level jammer in a military operations area.

At present, known techniques exist for improving the interference tolerance of GPS receivers.

Among the known techniques, there are analog techniques or 1-bit digitizing techniques, but the most advantageous is two-bit digitizing, also called non-uniform conversion.

Two-bit digitizing makes it possible to receive GPS signals despite the presence of interference in the form of sine waves or "continuous wave" (CW) according to the terminology generally used by the person skilled in the art.

Here the implementation of two-bit digitizing is explained.

Figure 1:
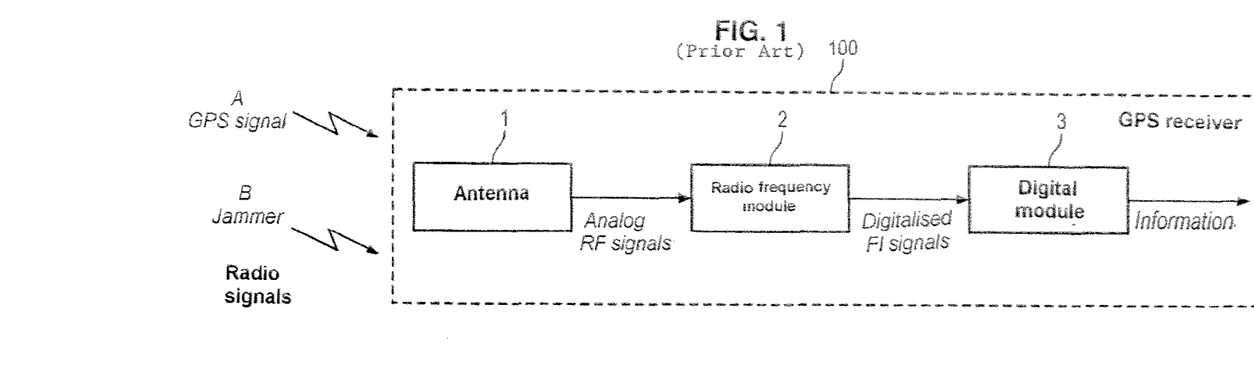
FIG. 1, discussed earlier, shows schematically a broadband signal receiver of the GPS type.

As shown in FIG. 1, a GPS localization receiver 100 is conventionally mainly constituted of three components, that is to say:

an antenna 1,
a radio frequency module 2, and
a digital module 3.

Radio frequency module 2 is located between antenna 1 and digital module 3.

Radio frequency module 2 generally includes an interference reduction system 20.

Figure 2:
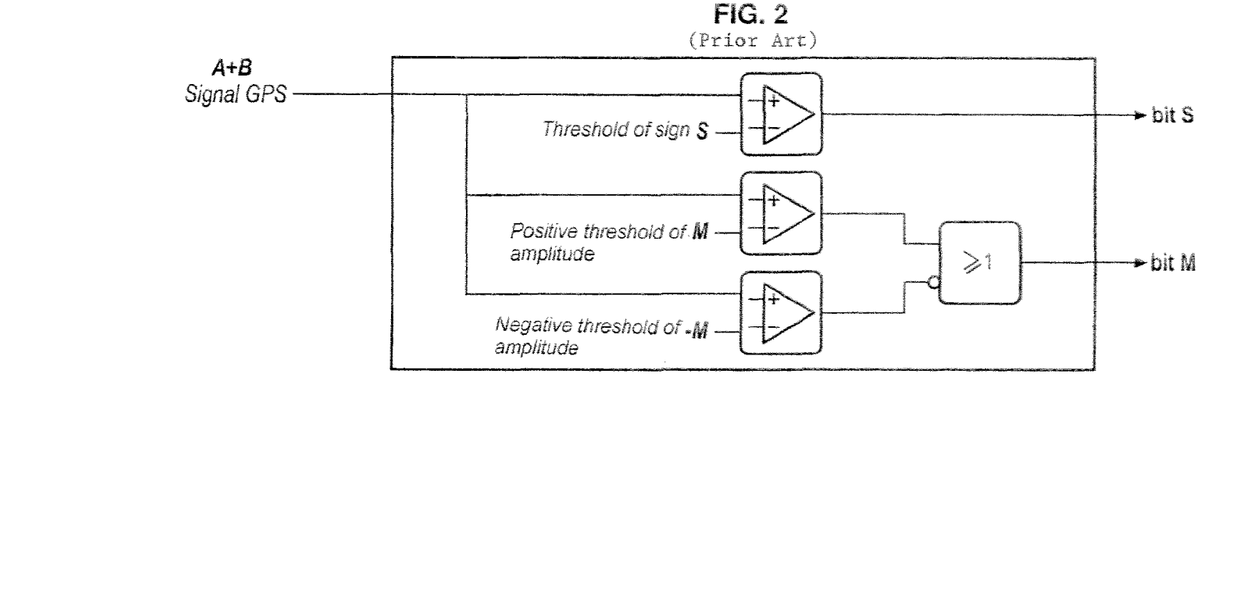
FIGS. 2 and 3, discussed earlier, show schematically a known interference reduction technique using two-bit digitizing.

As shown in FIG. 2, the aforementioned two-bit digitizing consists of creating, by thresholding, two bits from a scrambled GPS signal consisting of GPS signal A and interference signal B.

The first bit is called the "sign bit" and is referred to as S.

The second bit is called the "amplitude bit" and is referred to as M.

The M bit's threshold is adjustable according to the type of signal A.

Figure 3:
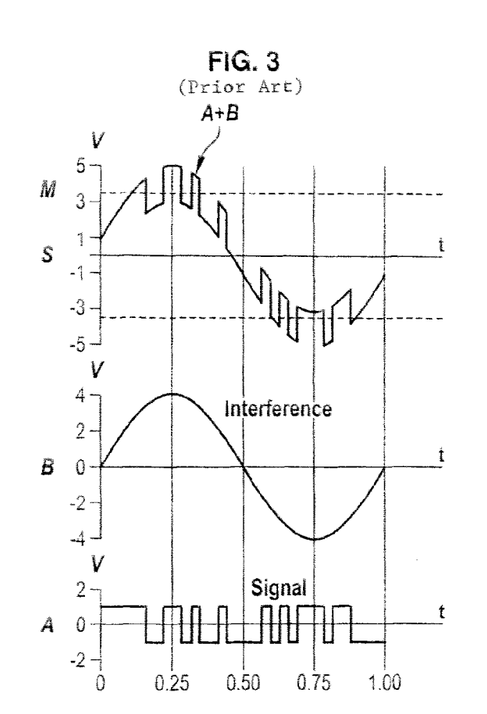

As shown in FIG. 3, when signal B is of the CW type, continuous digitizing makes it possible to recover signal A from signal A+B, due in particular to the creation of bit M.

Digitizing using more than two bits is also known.

The known technique of conversion using at least two bits has advantages.

Under a strong CW type interference, and compared with an analog solution, one-bit digitizing can degrade the signal-to-noise ratio by nearly 7 dB.

On the contrary, under the same CW jammer, two-bit digitizing allows the signal-to-noise ratio to be significantly improved. The signal-to-noise ratio is then optimal if the samples for which bit M is not activated are ignored at the bit converter output, which amounts to digitizing the signal using only 1.5 bits. Thus, under a strong CW type interference, and compared with an analog solution, 1.5-bit digitizing can improve the signal-to-noise ratio by more than 10 dB, when the duty cycle of bit M is set, for example, at 20%.

Further, under gaussian interference and compared with an analog solution, two-bit digitizing allows the degradation of the signal-to-noise ratio to be limited to less than 0.6 dB, as opposed to 1.96 dB for one-bit digitizing.

Two-bit digitizing does have disadvantages, however.

There is in fact a more subtle way to jam GPS signals than to jam them with a CW type signal, whose energy forms a line in the reception spectrum of GPS signals, and whose amplitude peak is also constant. Thus one jamming solution is to adopt a gaussian jammer in a broadened band. The energy of the jamming signal will thus spread itself through the reception spectrum of the GPS signals, with rapid fluctuations in the peak amplitude of the jamming signal, and will thus be more difficult to reject.

A technique for rejecting CW type jamming signals is known from U.S. Pat. No. 7,324,037. But this technique does not allow processing of gaussian type interference.

SUMMARY OF THE INVENTION

In one implementation of a method for reducing an interference signal interfering with a broadband spread-spectrum signal reaching a receiver, the receiver including an interference signal reduction system including
  an automatic gain controller including
    at least one amplifier and a gain control, and
    an analog-to-digital converter, and
  a weighting unit placed at the output of the automatic gain controller,
  the automatic gain controller continuously carries out a normalization of an instantaneous peak amplitude of the interference signal, such that said instantaneous peak amplitude is constant in time for the normalized interference signal,
    the normalized interference signal being converted into a sinusoidal interference signal, when the interference signal is narrow-band,
    the normalized interference signal remaining a Gaussian interference signal, when the interference signal has a bandwidth wider than a narrow-band,
  the analog-to-digital converter of the automatic gain controller carries out
  in the one hand digitizing of the normalized interference signal, using at least two bits, i.e. creating a sign hit and at least one amplitude bit, and
  in the other hand creating a type bit which differs according to whether the normalized interference signal is sinusoidal or Gaussian,
    the type bit being a Gaussian bit, when the normalized interference signal is a Gaussian interference signal,
    the type bit being a sinusoidal bit, when the normalized interference signal is a sinusoidal interference signal, and
  the weighting unit carries out a weighting of the digitized normalized interference signal output by the automatic gain controller, according to the type hit, using an assignment table stored in a memory of the weighting unit.

In another implementation, the type bit is obtained by comparing a filtered auxiliary amplitude bit to a type threshold.

In another implementation, the weighting is a weighting of a two-bit digitizing, if the type bit is Gaussian, and a weighting of a 1.5-bit digitizing, if the type bit is sinusoidal.

In another implementation, weighting coefficients in the assignment table are equal to −3, −1, +1, or +3 for a weighting of a two-bit digitizing, and

−3, 0, 0, or +3 for a weighting of a 1.5-bit digitizing.

In another implementation the broadband spread-spectrum signal is a GPS or GNSS signal, and the receiver is a GPS or GNSS receiver.

The invention also relates to a receiver that implements the aforementioned method.

The invention has numerous advantages.

The invention makes it possible to reject a noise signal which is not of the sine wave (CW) type.

The present invention allows a reduction in the so-called narrow-band interference signal, typically with a bandwidth up to 100 kHz.

The invention applies to broadband spread-spectrum signals, for example of the CDMA (Code Division Multiple Access) type, known to the person skilled in the art, typically but without limitation, to GPS/GNSS signals, whether BPSK (Binary Phase Shift Keying) modulated, or by BOC (Binary Offset Carrier) and derived techniques.

The invention allows a maximum improvement in narrow-band jammer reduction, typically with bandwidths up to 100 kHz.

BRIEF DESCRIPTION OF THE DRAWINGS

Other features, objects and advantages of the invention will appear from the description that follows, which is purely illustrative and not limiting, and which should be read with reference to the annexed drawings in which.

In all the drawings, similar components have identical reference numbers.

DETAILED DESCRIPTION OF THE BEST MODE TO CARRY OUT THE INVENTION

FIGS. 4 through 9 show schematically a possible implementation of a method for reducing an interference signal B interfering with a spread-spectrum broadband signal A.

Signal A is a spread-spectrum signal for example of the CDMA (Code Division Multiple Access) or FDMA (Frequency Division Multiple Access) type known to the person skilled in the art, typically but without limitation a GPS or GNSS signal, modulated by BPSK (Binary Phase Shift Keying) or BOC (Binary Offset Carrier) and derived techniques.

Signal A is generated conventionally by modulating a radio-frequency carrier with a composite signal. We repeat that the modulation can preferably have two phase states according to the BPSK technique known to the person skilled in the art. Signal A is then the sum of a low-frequency signal (typically 50 bits/s) and a high frequency pseudo-random spreading sequence (typically an integer multiple of 1,023 Mbits/second). We repeat that the signal can also be modulated by a subcarrier according to BOC and derived techniques known to the person skilled in the art.

Figure 4:
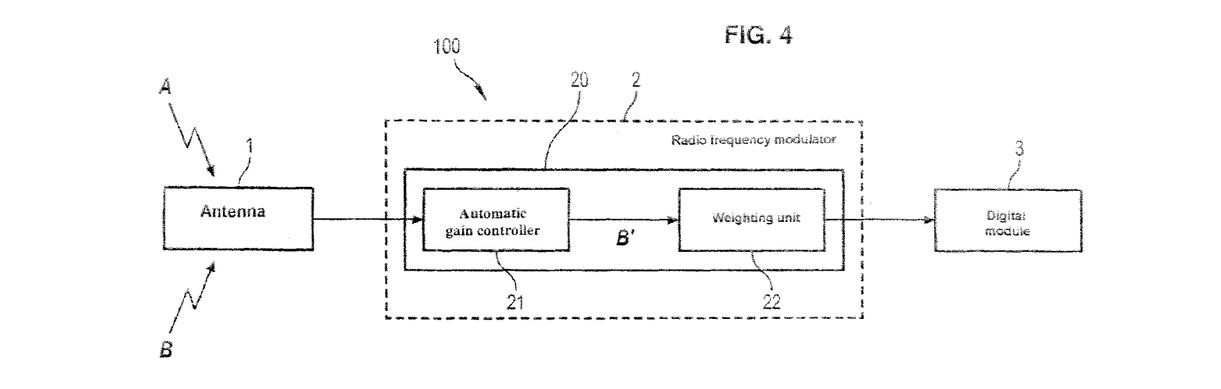
FIG. 4 shows schematically a receiver according to the invention which includes an automatic gain controller and optionally a weighting unit.

Signal A is sent to a receiver 100.

As FIG. 4 shows schematically, the receiver 100 mainly includes an antenna 1 and a radio-frequency module 2 connected to the output of antenna 1.

The output of module 2 is sent to digital module 3.

Module 2 includes an interference signal B reducing system 20.

System 20 includes mainly an automatic gain controller 21.

Figure 5:
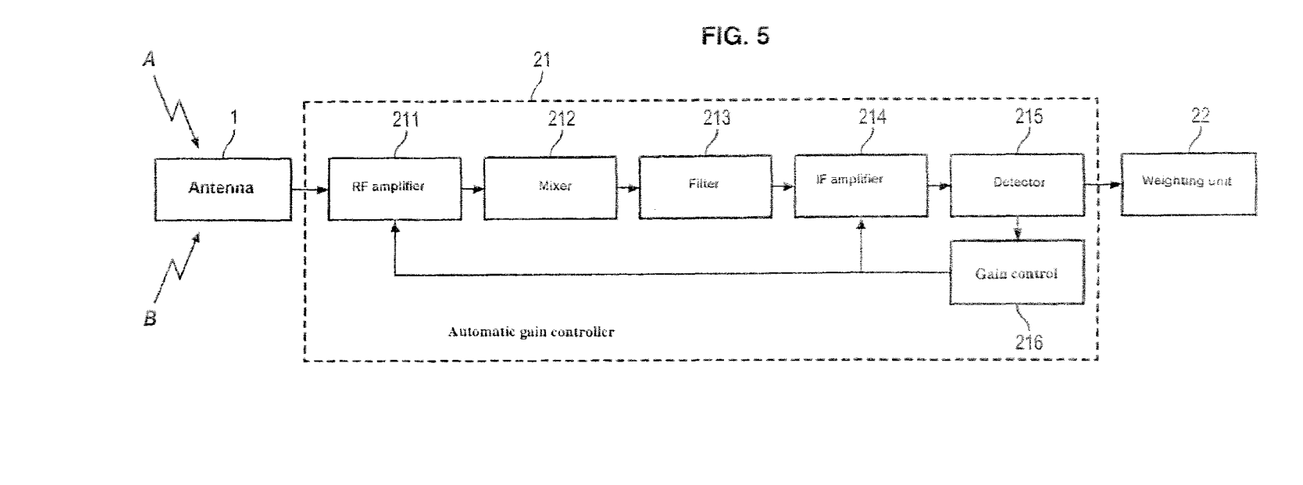
FIG. 5 shows schematically a more detailed view of the controller of FIG. 4 including a detector.

Controller 21 is described more particularly in FIG. 5.

Controller 21 processes all incoming signals, i.e. signal A and interference signal B.

Figure 8:
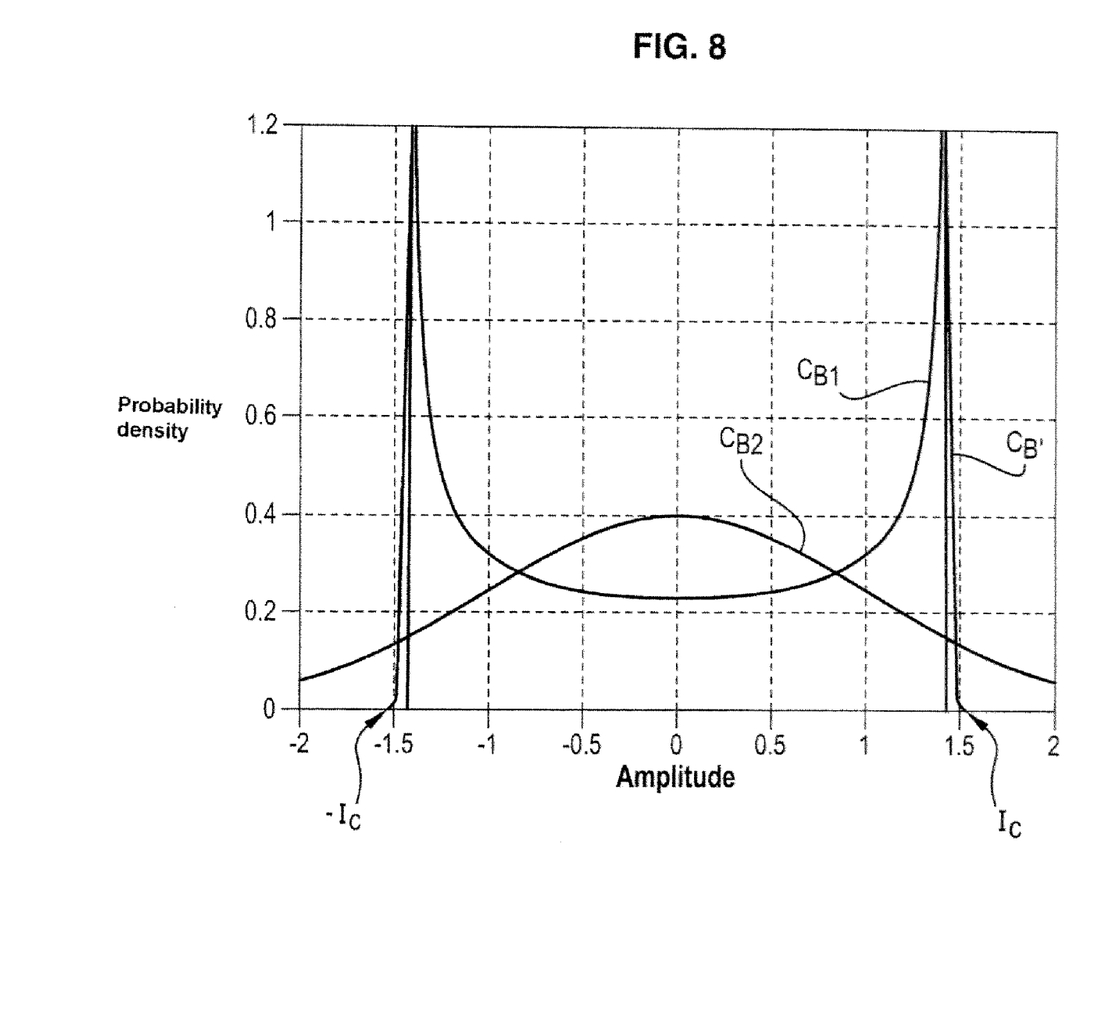
FIG. 8 is a curve showing schematically the probability density of the interference signal as a function of amplitude, for a CW type interference signal and for a narrow-band interference signal, respectively.

Interference signal B can typically be of two types, as shown schematically in FIG. 8.

The first kind, referred to as B1, is a sinusoidal interference signal called CW (or Continuous Wave). Signal B1 shows only a distinct line at a given frequency within the reception spectrum, and shows an instantaneous amplitude probability density curve $C_{B1}$ bounded between two peak amplitude values [−Ic; Ic].

The second type of interference signal, referred to as B2, is a signal called narrow-band because it occupies a band of a given width within the reception spectrum (the width is generally less than 100 kHz). Signal B2 has a probability density curve $C_{B2}$ of gaussian form.

It is understood that a CW type signal B1 has the property of having a constant envelope bounded between [−Ic; Ic] (the instantaneous peak amplitude of signal B1 is constant in time), while a narrow-band signal B2 has a pseudo-random envelope.

According to the invention, controller 21 allows a gaussian narrow-band signal probability density curve $C_{B2}$ to be transformed into that of a CW type interference signal.

To this end, controller 21 carries out a continuous normalization of an instantaneous peak amplitude of signal 13, such that said instantaneous peak amplitude is constant in time for the signal thus normalized.

In this way and as shown by FIG. 8, an instantaneous amplitude probability density curve $C_{B'}$ of normalized signal B' is bounded between two peak amplitude values [−Ic; Ic].

The normalized interference signal B' is converted into a sinusoidal interference signal, when the interference signal B is narrow-band, i.e. has a bandwidth up to 100 kHz.

However, the normalized interference signal B' remains a Gaussian interference signal, when the interference signal B has a bandwidth wider than a narrow-band, i.e. wider than 100 kHz.

This normalization will allow system 20 to carry out a previously described digitizing process using two non-uniform bits, as for CW type interference.

It is noted that controller 21 includes, preferably in this order:
- a radio-frequency RF amplifier 211;
- a mixer 212,
- a filter 213,
- an intermediate frequency amplifier 214,
- a detector 215, and
- a control 216.

Amplifier 211 and/or amplifier 214 includes a variable gain that can be controlled by control 216, connected for this purpose to the output of detector 215.

Mixer 212 carries out a frequency conversion of radio frequencies intermediate frequencies IF.

Controller 21 also incorporates a local oscillator, not shown, supplying mixer 212.

Filter 213 is a channel filter using surface wave technology. Filter 213 is therefore frequency-limited by design and has a high group propagation time, to wit on the order of 700 ns. It is nevertheless necessary for good reception of signals A.

Thus, to counteract the relatively long propagation time of filter 213, the gain of amplifier 211 and the gain of amplifier 214 are controlled by control 216. The pass band of amplifier 211 and the pass band of amplifier 214 are preferably wider than 100 kHz, which makes it possible to attenuate the delay of filter 213.

Figure 6:
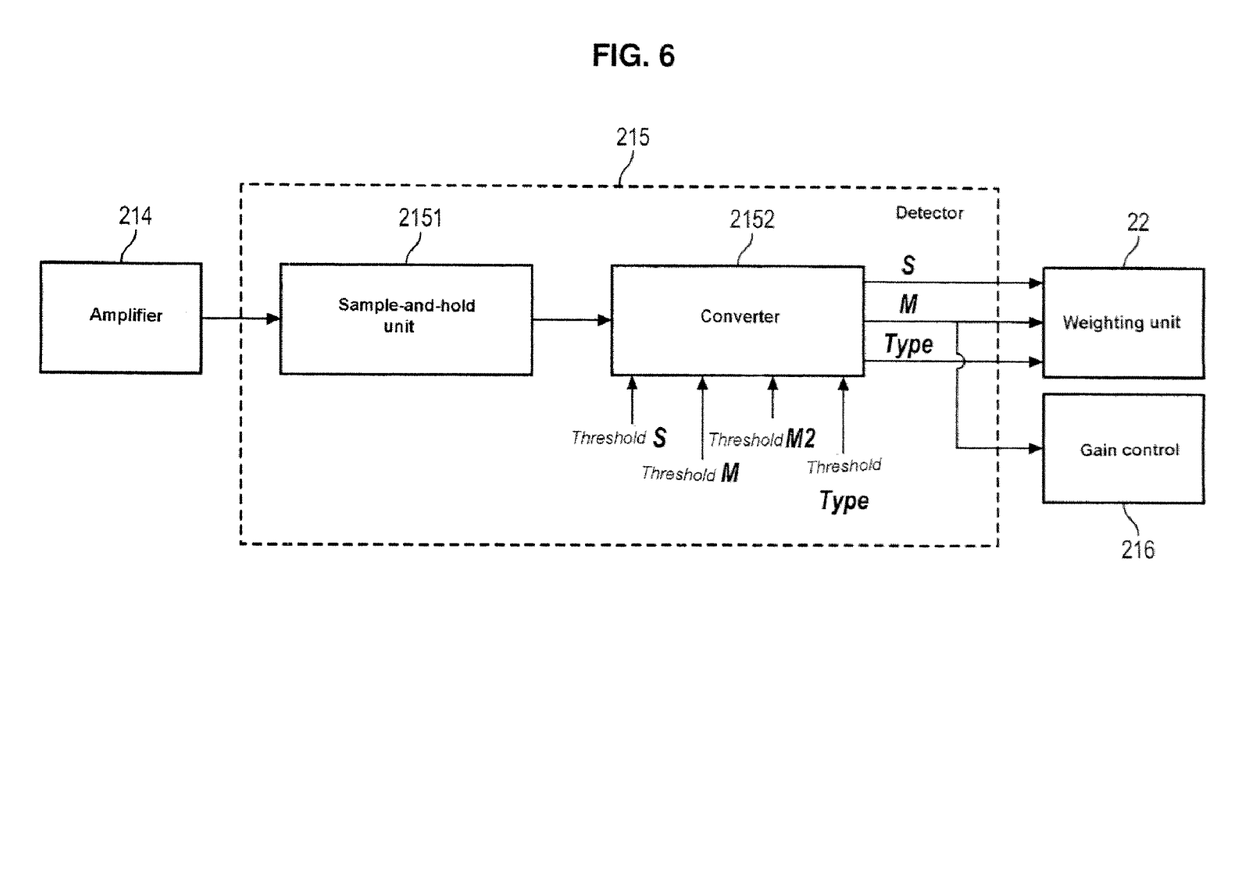
FIG. 6 is a more detailed view of the detector of FIG. 5.

Detector 215 is more particularly shown in FIG. 6.

It includes a sample-and-hold unit 2151 whose output is connected to the input of an analog-to-digital converter 2152.

Converter 2152 digitizes, using two bits, the signal output by the sample-and-hold unit, and also generates a type bit that differs depending on whether this normalized signal is Gaussian or sinusoidal. It is reminded that
- the normalized interference signal B' is converted into a sinusoidal interference signal, when the interference signal B is narrow-band, i.e. has a bandwidth up to 100 kHz, but that
- the normalized interference signal B' remains a Gaussian interference signal, when the interference signal B has a bandwidth wider than a narrow-band, i.e. wider than 100 kHz.

A threshold S whose value is set to 0, a threshold M, an auxiliary amplitude threshold M2 and a type threshold are connected to the input of converter 2152. Detector 215 thus allows the extraction:
- of sign bits S,
- of amplitude bits M, and
- of the type bits.

The duty cycle of bit M is held constant by a gain control loop, not shown, which adjusts the input level of sample-and-hold unit 2151.

Sample-and-hold unit 2151 follows signal conversion rules and the Nyquist-Shannon criterion.

Converter 2152 is thus a comparator-based converter whose thresholds, mentioned earlier, are fixed.

Figure 7:
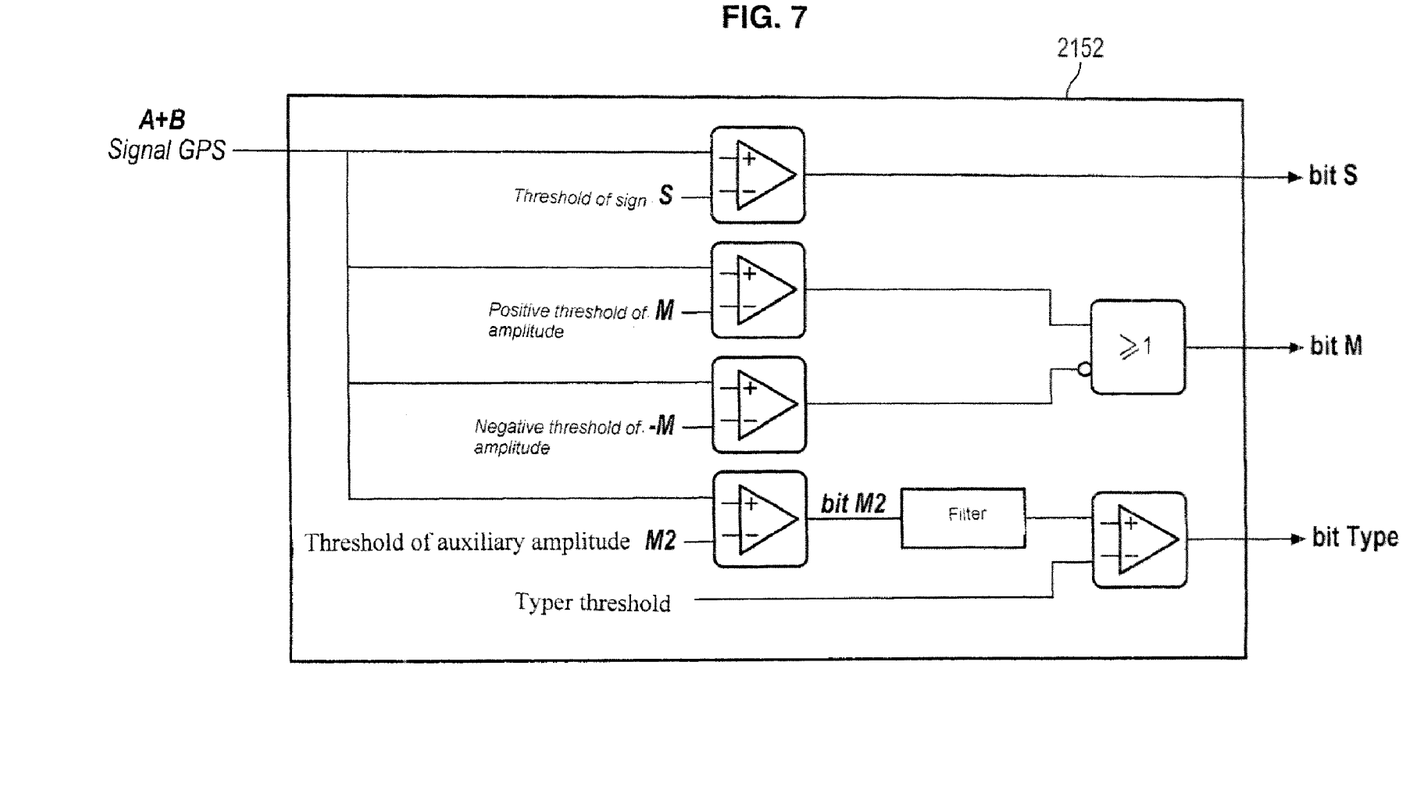
FIG. 7 shows schematically a more detailed view of a converter according to FIG. 6.

As shown by FIG. 7, threshold S and threshold M allow the two-bit digitizing of the input signal, with extraction of sign bits S and amplitude bits M.

The auxiliary amplitude threshold M2 is used for extraction of an auxiliary amplitude bit M2, for the purpose of generating the type bit. Threshold M2 is set relative to threshold M. The selected threshold M2 is lower than threshold M.

The type bit is obtained by measuring the duty cycle of bit M2. More precisely, the type bit is obtained by comparing the low-pass filtered bit M2 with the type threshold.

The selected type threshold has a value between the theoretical value of the duty cycle of bit M2 obtained when the input signal has a gaussian type probability density, and the theoretical value of the duty cycle of bit M2 obtained when the input signal has a CW type probability density. These values are known by the skilled in the art.

Thus, at the output of converter 2152, the behaviour of the type bit is then as follows:
- when the input signal is of gaussian type, the filtered M2 bit is lower than the type threshold, and the type bit takes on the value 0.
- when the input signal is of CW type, the filtered M2 bit is higher than the type threshold, and the type bit takes on the value 1.

As can be noted in FIG. 6, only bit M is used by gain control 216, to close the gain control servo-loop inside the controller 21.

Controller 21 called "fast" because it is capable of following the rate of amplitude variation of the incoming interference signal B. The pass band of controller 21 is wider than 100 kHz. Any frequency variation with a frequency less than the cutoff frequency of controller 21 will be normalized and will therefore have a constant instantaneous peak amplitude.

Advantageously, and as shown by FIGS. 4 through 6 for example, system 20 can also include a weighting unit 22 at the output of controller 21, upstream of module 3.

Weighting unit 22 has the function of optimizing the weighting of the normalized and digitized signal. The purpose of weighting unit 22 is to reject the samples of signal A+B containing too little signal A and too much noise B. The weighting unit then accentuates the normalization when a CW or narrow-band type jammer interferes with signal A.

Figure 9:
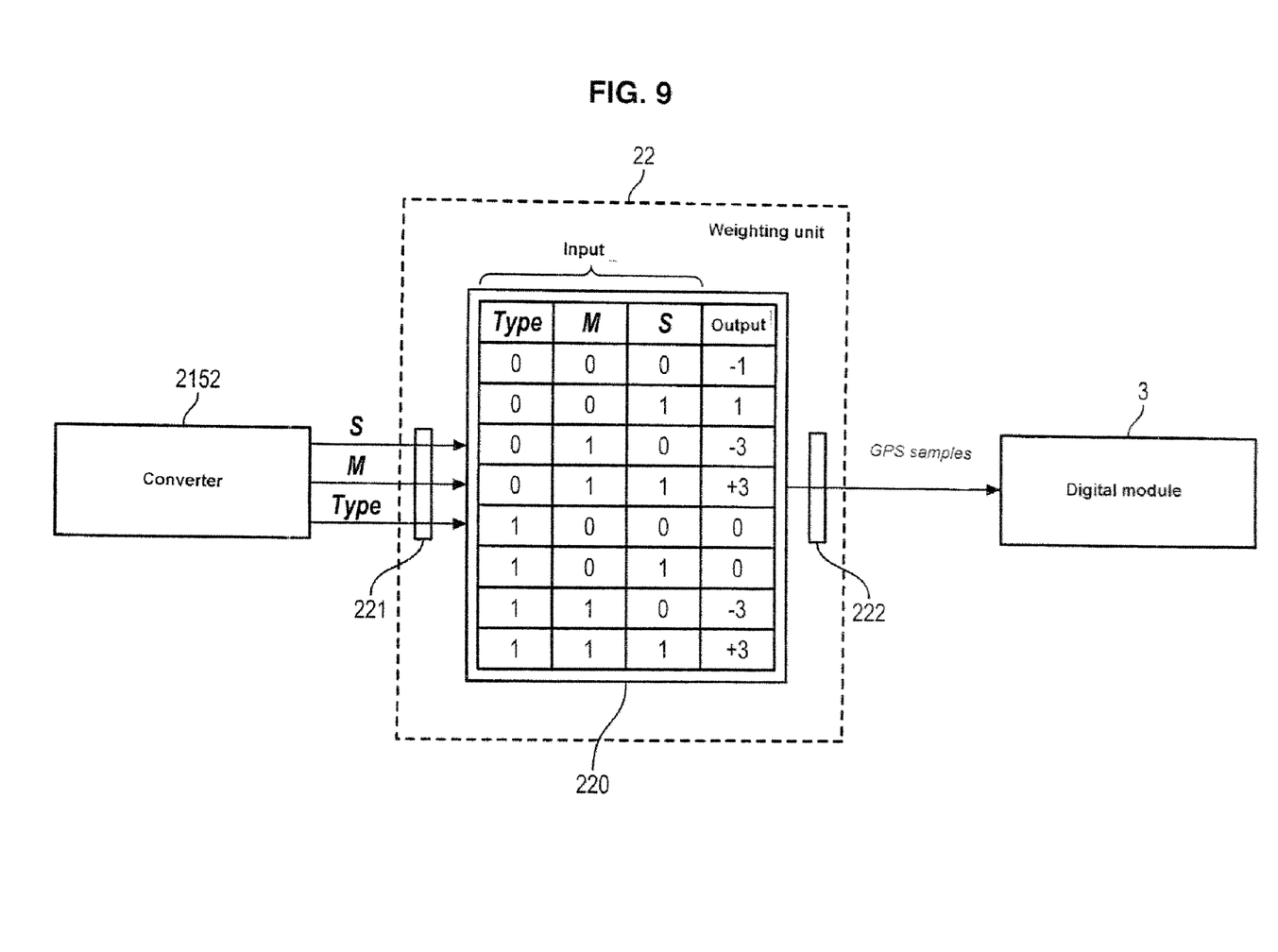
FIG. 9 shows schematically a more detailed view of the weighting unit of FIG. 4.
Figure 10:
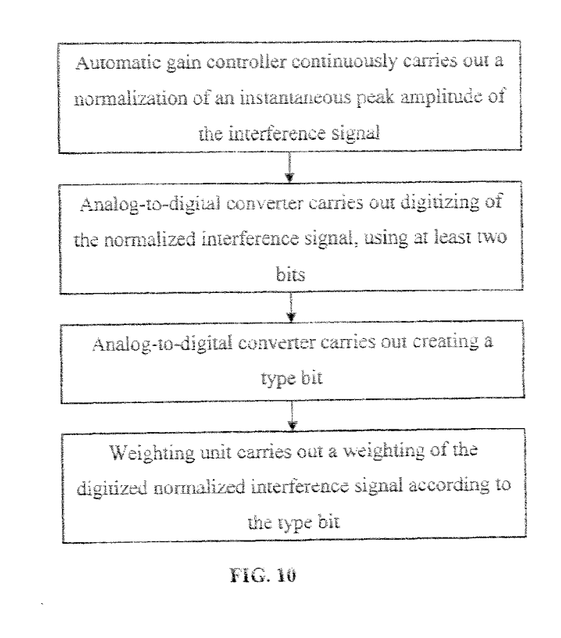
FIG. 10 shows schematically some steps of a method according to the invention.

As shown by FIG. 9, weighting unit 22 therefore includes an interference signal B type module 221 and a sample weighting module 222.

Weighting unit 22 uses, thanks to module 221, the type bit output by converter 2152 to modify the weights of the amplitude bits M and sign bits S.

The weight modification is carried out, thanks to module 222, using an assignment table 220 shown in FIG. 8, stored in a memory of the weighting unit.

The type bit output by converter 2152 has the following behaviour:
- it is equal to 0 if the input signal has a gaussian probability density (the type bit is said "Gaussian");
- it is equal to 1 if the input signal has a CW type probability density (the type bit is said "sinusoidal").

It is understood that the CW type probability density may come directly from a CW type signal, or can be from a narrow-hand type signal processed by controller 21.

The samples entering digital module have their weighting modified according to the type of input signal:
- if the input signal is of gaussian type, the weighting is that of conventional two-bit digitizing;
- if the input signal is of CW type, the weighting is shifted to that of a 1.5 bit digitizing.

The samples entering digital module 3 have their weights modified according to the type of input signal:
- thus, the weighting coefficients in the assignment table are equal to
  −3, −1, +1, or +3 if the input signal is of the gaussian type; i.e. for a weighting of a two-bit digitizing,
- they are equal to −3, 0, 0, or +3 if the input signal is of CW type, i.e. for a weighting of a 1.5-bit digitizing.

The invention claimed is:

1. A method for reducing an interference signal interfering with a broadband spread-spectrum signal reaching a receiver, said receiver including an interference signal reduction system including:
    an automatic gain controller having:
    at least one amplifier and a gain control, and
    an analog-to-digital converter, and
    a weighting unit placed at the output of the automatic gain controller, said method comprising the steps of:
continuously carrying out, by the automatic gain controller, a normalization of an instantaneous peak amplitude of the interference signal, such that said instantaneous peak amplitude is constant in time for the normalized interference signal,
converting the normalized interference signal into a sinusoidal interference signal when the interference signal is narrow-band, the normalized interference signal being a Gaussian interference signal, when the interference signal has a bandwidth wider than a narrow-band,
carrying out, by the analog-to-digital converter of the automatic gain controller: one of digitizing of the normalized interference signal, using at least two bits, thereby creating a sign bit and at least one amplitude bit, and creating a type bit which differs according to whether the normalized interference signal is sinusoidal or Gaussian, the type bit being a Gaussian bit, when the normalized interference signal is a Gaussian interference signal, the type bit being a sinusoidal bit, when the normalized interference signal is a sinusoidal interference signal, and
the weighting unit weighting the digitized normalized interference signal output by the automatic gain controller, according to the type bit, using an assignment table stored in a memory of the weighting unit.

2. A method according to claim 1, wherein the type bit is obtained by comparing a filtered auxiliary amplitude bit to a type threshold.

3. A method according to claim 1, wherein the weighting is a weighting of a two-bit digitizing, if the type bit is Gaussian, or a weighting of a 1.5-bit digitizing, if the type bit is sinusoidal.

4. A method according to claim 3, wherein weighting coefficients in the assignment table are equal to $-3$, $-1$, $+1$, or $+3$ for a weighting of a two-bit digitizing, and $-3$, $0$, $0$, or $+3$ for a weighting of a 1.5-bit digitizing.

5. A method according to claim 1, wherein the broadband spread-spectrum signal is a GPS (Global Positioning System) or GNSS (Global Navigation Satellite System signal, and the receiver is a GPS or GNSS receiver.

6. A receiver designed to reduce an interference signal interfering with a broadband spread-spectrum signal, said receiver including an interference signal reduction system, wherein the interference signal reduction system also comprises
    an automatic gain controller including:
    at least one amplifier chosen from the group consisting of a radio frequency amplifier and an intermediate frequency amplifier, and having a variable gain, and
    a gain control controlling the variable gain of the amplifier, the automatic gain controller being designed to carry out a continuous normalization of an instantaneous peak amplitude of the interference signal, such that said instantaneous peak amplitude is constant in time, the normalized interference signal being converted into a sinusoidal interference signal, when the interference signal is narrow-band, the normalized interference signal being a Gaussian interference signal, when the interference signal has a bandwidth wider than a narrow-band,
    the automatic gain controller further comprising:
    an analog-to-digital converter digitizing the normalized interference signal, using at least two bits, thereby creating a sign bit and at least one amplitude bit, and creating a type bit which differs according to whether the normalized interference signal is sinusoidal or Gaussian, the type bit being a Gaussian bit, when the normalized interference signal is a Gaussian interference signal, the type bit being a sinusoidal bit, when the normalized interference signal is a sinusoidal interference signal, and
    wherein the interference signal reduction system also includes a weighting unit for weighting the digitized normalized signal output by the automatic gain controller, according to the type bit, using an assignment table stored in a memory of the weighting unit.

7. A receiver according to claim 6, in which the automatic gain controller has a pass band wider than 100 kHz.

8. A receiver according to claim 6, in which the amplifier has a pass band wider than 100 kHz.

* * * * *

UNITED STATES PATENT AND TRADEMARK OFFICE
CERTIFICATE OF CORRECTION

PATENT NO. : 8,345,730 B2
APPLICATION NO. : 12/968136
DATED : January 1, 2013
INVENTOR(S) : Jean-Christophe Le Liboux, Nicolas Descomps and Ghislain Luneau It is certified that error appears in the above-identified patent and that said Letters Patent is hereby corrected as shown below:

In the Claims:

Column 7, Claim 1, line 19, please delete "signal," and insert --signal--.

Column 7, Claim 3, line 40, please delete "two-hit," and insert --two-bit--.

Column 8, Claim 5, line 3, please delete "System," and insert --System)--.

Signed and Sealed this
Eighteenth Day of June, 2013

Teresa Stanek Rea
*Acting Director of the United States Patent and Trademark Office*